(12) United States Patent
Yeom et al.

(10) Patent No.: US 12,302,575 B2
(45) Date of Patent: May 13, 2025

(54) MEMORY DEVICE

(71) Applicant: SAMSUNG ELECTRONICS CO., LTD., Suwon-si (KR)

(72) Inventors: Kyongsik Yeom, Suwon-si (KR); Changmin Jeon, Yongin-si (KR); Yongkyu Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 430 days.

(21) Appl. No.: 17/725,993

(22) Filed: Apr. 21, 2022

(65) Prior Publication Data

US 2023/0035568 A1   Feb. 2, 2023

(30) Foreign Application Priority Data

Aug. 2, 2021   (KR) .................. 10-2021-0101253

(51) Int. Cl.
*H01L 23/535*   (2006.01)
*H01L 27/11582*   (2017.01)
*H10B 43/35*   (2023.01)

(52) U.S. Cl.
CPC .................................. *H10B 43/35* (2023.02)

(58) Field of Classification Search
CPC ........... G11C 16/0466; G11C 16/0433; H10B 43/35; H01L 29/42344; H01L 29/40117; H01L 29/66833
See application file for complete search history.

(56) References Cited

U.S. PATENT DOCUMENTS

| | | | |
|---|---|---|---|
| 8,466,012 B1 * | 6/2013 | Chang | H01L 21/823821 438/149 |
| 9,224,497 B2 | 12/2015 | Wu et al. | |
| 9,935,113 B2 | 4/2018 | Wu et al. | |
| 10,147,488 B2 | 12/2018 | Hisamoto | |
| 10,163,920 B2 | 12/2018 | Chen et al. | |
| 10,777,288 B2 | 9/2020 | Kurjanowicz | |
| 2004/0212008 A1 * | 10/2004 | Hasegawa | H01L 27/105 257/E27.081 |
| 2010/0044779 A1 * | 2/2010 | Seol | H01L 29/42344 257/326 |
| 2014/0048867 A1 | 2/2014 | Toh et al. | |
| 2015/0035039 A1 | 2/2015 | Li et al. | |
| 2017/0169075 A1 * | 6/2017 | Jiang | G06F 3/061 |
| 2019/0088783 A1 | 3/2019 | Toh et al. | |
| 2020/0058660 A1 | 2/2020 | Chang et al. | |
| 2020/0075610 A1 | 3/2020 | Wu et al. | |
| 2020/0105356 A1 | 4/2020 | Kulkarni et al. | |
| 2020/0243545 A1 * | 7/2020 | Yamakoshi | H10B 43/10 |
| 2020/0295161 A1 | 9/2020 | Toh et al. | |
| 2021/0159346 A1 * | 5/2021 | Ramkumar | G11C 16/0483 |

* cited by examiner

*Primary Examiner* — John A Bodnar
(74) *Attorney, Agent, or Firm* — MORGAN, LEWIS & BOCKIUS LLP

(57) ABSTRACT

A memory device includes a first bit line configured to supply a first bit line bias voltage, a memory cell transistor having a first operating voltage, a selection transistor having a second operating voltage and configured to control the supply of the first bit line bias voltage to a source of the memory cell transistor, and a second bit line connected to a drain of the memory cell transistor. A level of the first operating voltage is about equal to a level of the second operating voltage.

20 Claims, 12 Drawing Sheets

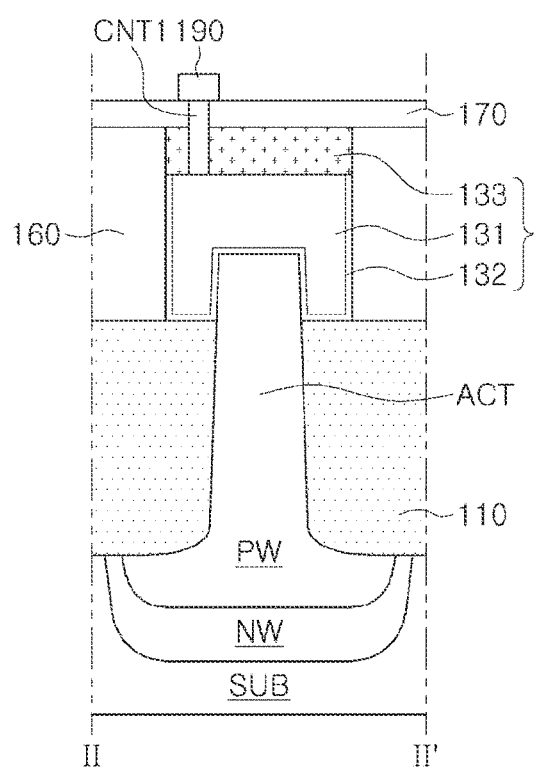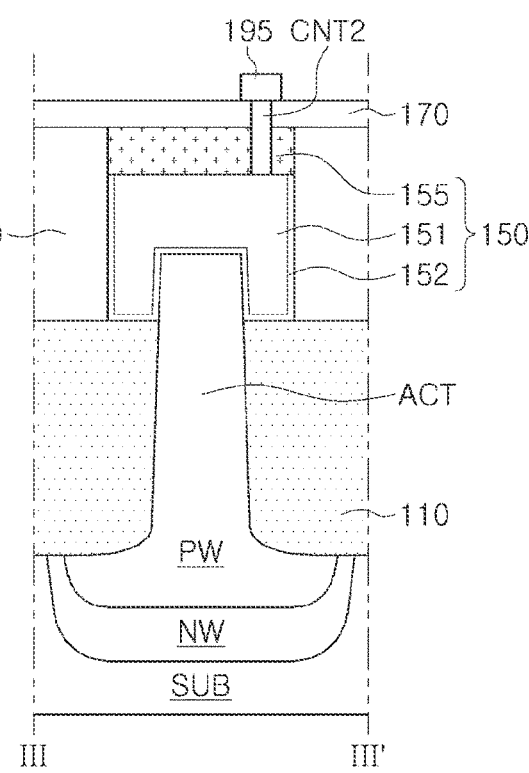
FIG. 6
FIG. 7

|         |       | BLA     | SL      | WL      | BLB     | PW  | NW      |
|---------|-------|---------|---------|---------|---------|-----|---------|
| Program | SEL   | 0.0     | 1.0~2.0 | 2.0~5.0 | 1.5~3.0 | 0.0 | 2.0~5.0 |
|         | UNSEL | 1.5~3.0 | 0.0     | 0.0     | 1.5~3.0 | 0.0 | 2.0~5.0 |

|     |       | BLA     | SL      | WL      | BLB     | PW      | NW      |
|-----|-------|---------|---------|---------|---------|---------|---------|
| ERS | SEL   | 0.0     | 1.0~2.0 | 0.0     | 2.0~5.0 | 2.0~5.0 | 2.0~5.0 |
|     | UNSEL | 1.5~3.0 | 0.0     | 1.5~3.0 | 1.5~3.0 | 0.0     | 2.0~5.0 |

|  |  | BLA | SL | WL | BLB | PW | NW |
|---|---|---|---|---|---|---|---|
| Read | SEL | 0.0 | 1.0~2.0 | 1.0~2.0 | 1.0~2.0 | 0.0 | 1.0~2.0 |
|  | UNSEL | 0.0 | 0.0 | 0.0 | 0.0 | 0.0 | 1.0~2.0 |

MEMORY DEVICE

CROSS-REFERENCE TO RELATED APPLICATION(S)

This application claims priority under 35 U.S.C. § 119 to Korean Patent Application No. 10-2021-0101253, filed on Aug. 2, 2021 in the Korean Intellectual Property Office, the disclosure of which is incorporated by reference herein in its entirety.

TECHNICAL FIELD

Example embodiments of the present inventive concept relate to a memory device.

DISCUSSION OF RELATED ART

Among multi-time programmable memories (MTPM), a memory based on a logic transistor assembled without an additional process or mask is referred to as a charge trap transistor (CTT)-based MTPM.

MTP memory cells that do not include the addition of a stacked layer are utilized in product groups in which a low number of program/erase (P/E) cycles and low memory density are desired. A CTT-based MTP memory cell is proposed in a FinFET process.

SUMMARY

An embodiment of the present inventive concept provides a memory device in which both a memory cell transistor and a selection transistor are driven by a high voltage in a CTT-based MTP memory cell.

According to an embodiment of the present inventive concept, a memory device includes a first bit line configured to supply a first bit line bias voltage, a memory cell transistor having a first operating voltage, a selection transistor having a second operating voltage and configured to control the supply of the first bit line bias voltage to a source of the memory cell transistor, and a second bit line connected to a drain of the memory cell transistor. A level of the first operating voltage is about equal to a level of the second operating voltage.

According to an embodiment of the present inventive concept, a memory device includes a first active region and a second active region disposed on a substrate, a first n-type metal-oxide semiconductor (NMOS) transistor on the substrate, and a second NMOS transistor disposed on the substrate. The first NMOS transistor includes a first gate structure crossing the first active region, and a first source region and a first drain region formed on the first active region on both sides of the first gate structure. The second NMOS transistor includes a second gate structure crossing the second active region, and a second source region and a second drain region formed on the second active region on both sides of the second gate structure. The first gate structure includes a first gate dielectric and a first gate electrode disposed on the first gate dielectric. The second gate structure includes a second gate dielectric and a second gate electrode disposed on the second gate dielectric. The first gate dielectric includes a first silicon oxide and a first high-k dielectric material disposed on the first silicon oxide. The second gate dielectric includes a second silicon oxide and a second high-k dielectric material disposed on the second silicon oxide. The second high-k dielectric material includes a charge trapping layer.

According to an embodiment of the present inventive concept, a memory device includes a first active region and a second active region, extending in a first direction perpendicular to an upper surface of a substrate, a first NMOS transistor disposed on a P-type well region, and a second NMOS transistor disposed on the P-type well region. The first NMOS transistor includes first gate structures overlapping the first active region, and including a first gate electrode, a first high-k dielectric material, and a first silicon oxide, and first source/drain regions connected to the first active region. The second NMOS transistor includes second gate structures overlapping the second active region, and including a second gate electrode, a second high-k dielectric material, and a second silicon oxide, and second source/drain regions connected to the second active region. The second high-k dielectric material is a charge trapping layer storing charges.

According to an embodiment of the present inventive concept, a memory device includes an active region disposed on a substrate, a first NMOS transistor disposed on the substrate, and a second NMOS transistor disposed on the substrate. The first NMOS transistor includes a first gate structure crossing the active region, and a source region and a first drain region formed on the active region on both sides of the first gate structure. The second NMOS transistor includes a second gate structure crossing the active region, and the source region and a second drain region formed on the active region on both sides of the second gate structure. The first gate structure includes a first gate dielectric and a first gate electrode disposed on the first gate dielectric. The second gate structure includes a second gate dielectric and a second gate electrode disposed on the second gate dielectric. The first gate dielectric includes a first silicon oxide and a first high-k dielectric material disposed on the first silicon oxide. The second gate dielectric includes a second silicon oxide and a second high-k dielectric material disposed on the second silicon oxide. The second high-k dielectric material includes a charge trapping layer.

BRIEF DESCRIPTION OF DRAWINGS

The above and other features of the present inventive concept will become more apparent by describing in detail embodiments thereof with reference to the accompanying drawings, in which:

FIG. 6 is a cross-sectional view taken along line II-II' of FIG. 4 according to an example embodiment of the present inventive concept;

FIG. 7 is a cross-sectional view taken along line of III-III' FIG. 4 according to an example embodiment of the present inventive concept;

DETAILED DESCRIPTION

Figure 1:
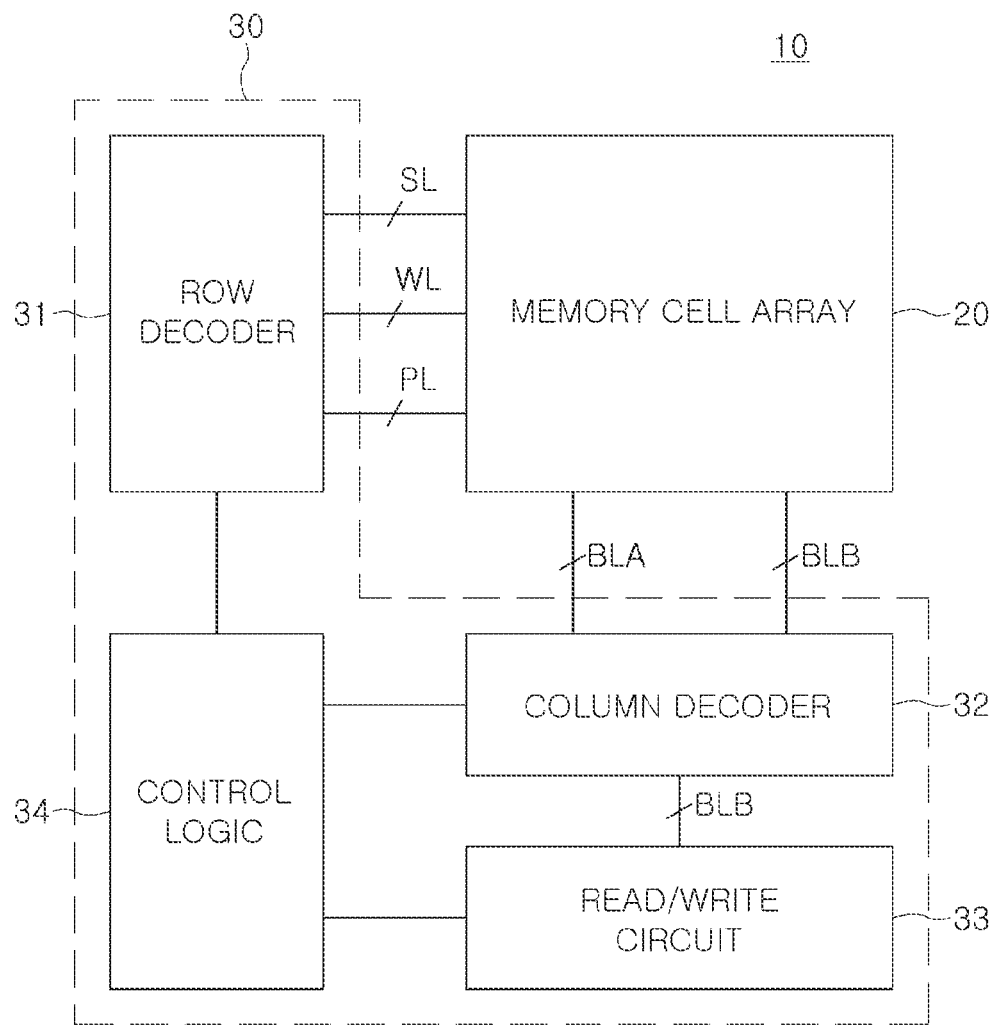
FIG. 1 is a diagram schematically illustrating a memory device according to an example embodiment of the present inventive concept.

Hereinafter, example embodiments of the present inventive concept will be described more fully hereinafter with reference to the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 is a diagram schematically illustrating a memory device according to an example embodiment of the present inventive concept.

Referring to FIG. 1, a memory device 10 may include a cell region and a peripheral circuit region 30. The peripheral circuit region 30 may include a row decoder 31, a column decoder 32, a read/write circuit 33, and a control logic 34.

The cell region may include a memory cell array 20. The memory cell array 20 may be connected to the row decoder 31 through word lines WL, selection lines SL, and well bias lines PL. The memory cell array 20 may be connected to the column decoder 32 through first bit lines BLA and second bit lines BLB.

The read/write circuit 33 may include a program circuit for writing data to at least one selection memory cell selected by the row decoder 31 and the column decoder 32, a readout circuit for reading data from the selected memory cell, etc. For example, the readout circuit may include sense amplifiers. A first input terminal of the sense amplifier may be connected to the second bit line BLB, and a read reference current may be input to a second input terminal of the sense amplifier. The sense amplifier may compare a level of a current flowing into the second bit line BLB with a level of the read reference current, and output a result of the comparison. The read/write circuit 33 may determine whether data stored in the selected memory cell is "0" or "1" according to the result of the comparison.

The row decoder 31, the column decoder 32, and the read/write circuit 33 may be controlled by the control logic 34. The control logic 34 may output various control signals to the row decoder 31, the column decoder 32, and the read/write circuit 33 in response to a command CMD and/or an address ADDR from a host.

The memory cell array 20 includes a plurality of non-volatile memory cells. For example, each of the plurality of memory cells may be a charge trap transistor (CTT)-based multi-time programmable (MTP) memory cell. The memory cell may include a memory cell transistor and a selection transistor controlling supply of a bit line bias voltage to the memory cell transistor. The memory cell transistor may be a CTT.

The memory cell transistor may have a first operating voltage, and the selection transistor may have a second operating voltage. For example, a level of the first operating voltage may be higher than a level of the second operating voltage. In other words, the memory cell transistor may be a transistor driven by a high voltage, and the selection transistor may be a transistor driven by a low voltage. For example, the level of the first operating voltage may be about 1.8V, and the level of the second operating voltage may be about 0.9V to about 1.0V. The operating voltage may be a power supply voltage VDD applied from outside, and internal voltages (e.g., a word line voltage, a bit line voltage, etc.) may be generated by the power voltage VDD.

For a selection transistor driven by a low voltage to control a bit line bias voltage applied to a memory cell transistor driven by a high voltage, a plurality of selection transistors may be connected in a cascade manner. The plurality of selection transistors connected in a cascade manner may be disposed between a source of the memory cell transistor and a first bit line and between a drain of the memory cell transistor and a second bit line.

According to an example embodiment of the present inventive concept, both the memory cell transistor and the selection transistor may be transistors driven by a high voltage. In other words, a level of the first operating voltage for driving the memory cell transistor and a level of the second operating voltage for driving the selection transistor may be about equal to each other. For the selection transistor driven by a high voltage to control a bit line bias voltage applied to the memory cell transistor, a transistor driven by a high voltage, e.g., one selection transistor, may be disposed between a source of the memory cell transistor and a first bit line. Accordingly, the number of selection transistors included in the memory cell may be reduced. Since the number of selection transistors included in the memory cell is reduced, the size of the memory cell may be reduced.

Figure 2:
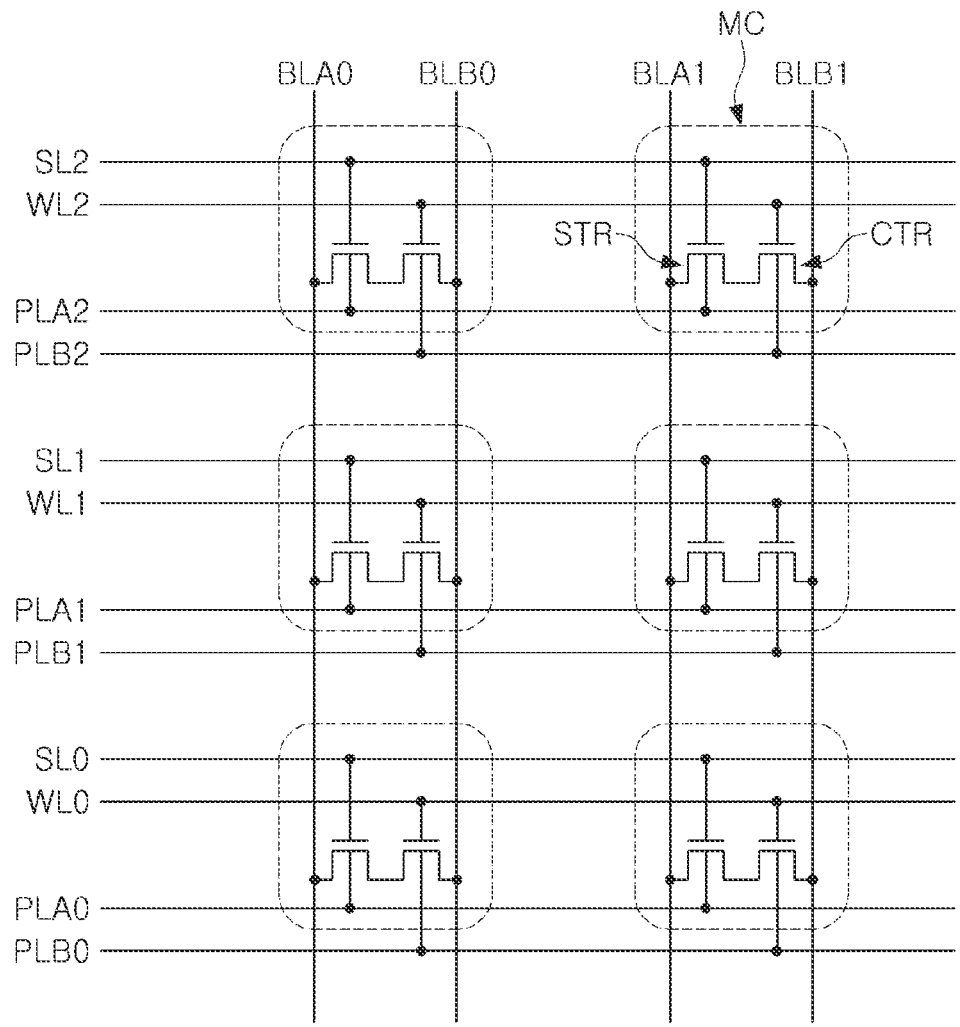
FIG. 2 is a diagram schematically illustrating a memory cell array according to an example embodiment of the present inventive concept.

FIG. 2 is a diagram schematically illustrating a memory cell array according to an example embodiment of the present inventive concept.

Referring to FIG. 2, a memory cell array 20 may include a plurality of word lines WL0 to WL12 (WL), a plurality of selection lines SL0 to SL2 (SL), a plurality of bit lines BLA0 to BLA1 (BLA) and BLB0 to BLB1 (BLB), a plurality of well bias lines PLA0 to PLA2 (PLA) and PLB0 to PLB2 (PLB), and a plurality of memory cells MC. The first bit line BLA may supply a first bit line bias voltage, and the second bit line BLB may supply a second bit line bias voltage.

Each memory cell MC may include a first n-type metal-oxide semiconductor (NMOS) transistor STR and a second NMOS transistor CTR. The first NMOS transistor STR may be a selection transistor, and the second NMOS transistor CTR may be a memory cell transistor. The selection transistor may control supply of a bit line bias voltage to a source of the memory cell transistor.

A drain of the first NMOS transistor STR may be connected to a first bit line BLA, and a drain of the second NMOS transistor CTR may be connected to a second bit line BLB. A source of the first NMOS transistor STR may be connected to a source of the second NMOS transistor CTR through a metal line. A gate of the first NMOS transistor STR may be connected to a gate selection line SL, and a gate of the second NMOS transistor CTR may be connected to a word line WL. The selection line SL may apply a gate voltage to the gate of the first NMOS transistor STR, and the word line WL may apply a word line voltage to the gate of the second NMOS transistor CTR.

The first NMOS transistor STR may control a connection between the source of the first bit line BLA and the second NMOS transistor CTR in response to the voltage of the selection line SL. In other words, the first NMOS transistor STR may control the supply of the first bit line bias voltage to the second NMOS transistor CTR. By blocking the first bit line bias voltage from being applied to the second NMOS transistor CTR of the selected memory cell among memory cells sharing the selected bit line, and blocking the first bit line bias voltage from being applied to the second NMOS transistors CTR of the unselected memory cell, the first NMOS transistor STR may prevent disturbance.

During a programming operation of the memory device, a high word line voltage may be applied to a gate of the second NMOS transistor CTR, and a high bit line bias voltage may be applied to a drain of the second NMOS transistor CTR. In this case, hot carrier injection may be increased, and electrons may be injected into a high-k dielectric material of the second NMOS transistor CTR.

According to an example embodiment of the present inventive concept, the first NMOS transistor STR and the second NMOS transistor CTR may be respectively formed in a P-type well region separated from each other. In other words, the first NMOS transistor STR may be formed in the first P-type well region, and the second NMOS transistor CTR may be formed in the second P-type well region, and the first P-type well region and the second P-type well region may be separated by a device isolation layer.

During an erase operation of the memory device, first well bias lines PLA may be applied to the first P-type well region in which the first NMOS transistor STR is formed, and second well bias lines PLB may be applied to the second P-type well region in which the second NMOS transistor CTR is formed. Accordingly, a well bias voltage may be independently applied to the first P-type well region in which the first NMOS transistor STR is formed and the second P-type well region in which the second NMOS transistor CTR is formed.

When a voltage difference is generated between the source and drain of the memory cell transistor CTR, and a positive well bias voltage is applied to the first P-type well region PW, similar to an operation of a bipolar junction transistor (BJT), a current may flow in a channel of the memory cell transistor CTR. As a current flows, Joule heat may be generated in the channel. Such self heating may increase electron de-trapping in a bulk direction.

According to an example embodiment of the present inventive concept, each of the memory cell transistor CTR and the selection transistor STR included in the memory cell may be a transistor driven by a high voltage. To control the bit line bias voltage applied to the memory cell transistor, one select transistor may be disposed between the source of the memory cell transistor and the first bit line. When the selection transistor STR is a transistor driven by a high voltage, the number of selection transistors STR included in the memory cell may be reduced compared to when the selection transistor STR is a transistor driven by a low voltage. According to an example embodiment, only one selection transistor STR is disposed between the source of the memory cell transistor and the first bit line. Accordingly, the size of the memory cell may be reduced.

Figure 3:
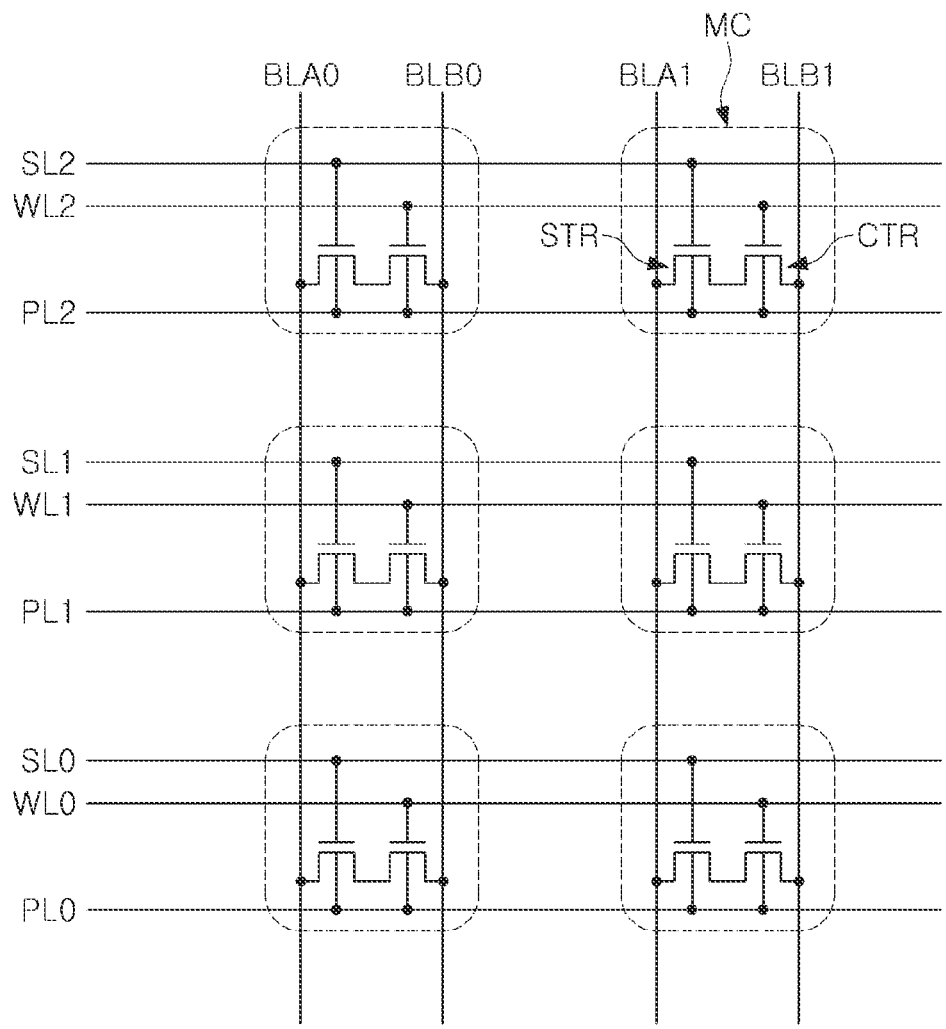
FIG. 3 is a diagram schematically illustrating a memory cell array according to an example embodiment of the present inventive concept.

FIG. 3 is a diagram schematically illustrating a memory cell array according to an example embodiment of the present inventive concept.

Referring to FIG. 3, for convenience of explanation, a further description of elements and technical aspects previously described with reference to FIG. 2 may be omitted.

Referring to FIG. 3, a memory cell array 20 may include a plurality of word lines WL0 to WL12 (WL), a plurality of selection lines SL0 to SL2 (SL), a plurality of bit lines BLA0 and BLA1 (BLA) and BLB0 and BLB1 (BLB), a plurality of well bias lines PL0 to PL2 (PL), and a plurality of memory cells MC. The first bit line BLA may supply a first bit line bias voltage, and the second bit line BLB may supply a second bit line bias voltage.

Each memory cell MC may include a first NMOS transistor STR and a second NMOS transistor CTR. The first NMOS transistor STR may be a selection transistor, and the second NMOS transistor CTR may be a memory cell transistor. The selection transistor may control supply of a bit line bias voltage to a source of the memory cell transistor.

According to an example embodiment described with reference to FIG. 2, a first P-type well region in which the first NMOS transistor STR is formed and a second P-type well region in which the second NMOS transistor CTR is formed may be separated by a device isolation layer. According to an example embodiment of FIG. 3, the first NMOS transistor STR and the second NMOS transistor CTR may be formed in one P-type well region. Accordingly, the first NMOS transistor STR and the second NMOS transistor CTR may share a well bias line PL for supplying a well bias voltage to the P-type well region in which the first NMOS transistor STR and the second NMOS transistor CTR is formed with each other. In addition, the first NMOS transistor STR and the second NMOS transistor CTR may share a source with each other. Accordingly, when the first NMOS transistor STR and the second NMOS transistor CTR are formed in one P-type well region, the size of the memory cell may be reduced.

During an erase operation of the memory device, the well bias lines PL may apply a well bias voltage to the P-type well region in which the first NMOS transistor STR and the second NMOS transistor CTR are formed. Accordingly, the same well bias voltage may be applied to the P-type well region in which the first NMOS transistor STR is formed and the P-type well region in which the second NMOS transistor CTR is formed.

Figure 4:
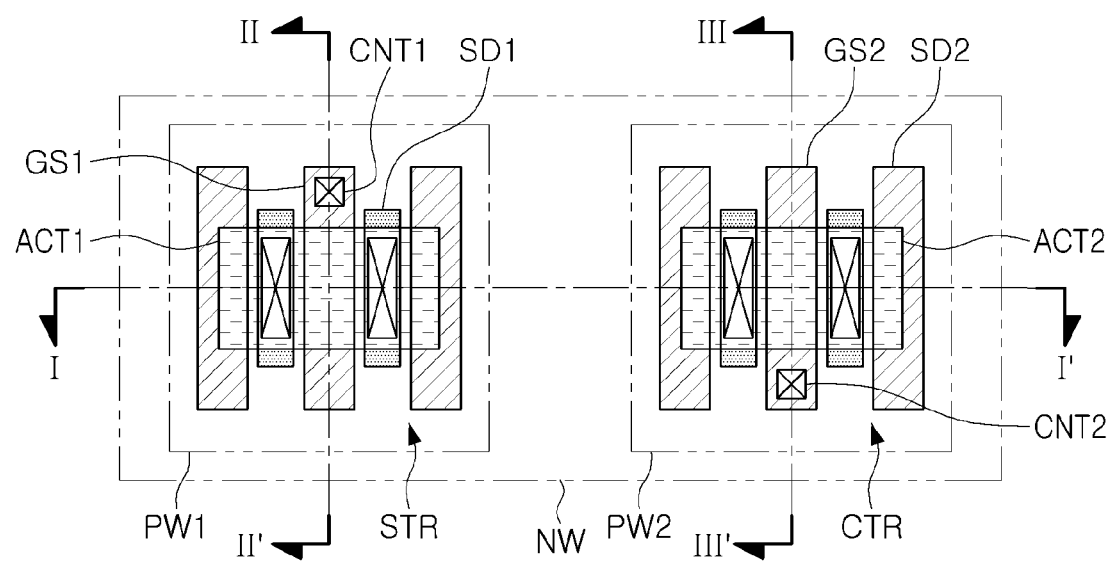
FIG. 4 is a diagram illustrating an arrangement of transistors according to an example embodiment of the present inventive concept.

FIG. 4 is a diagram illustrating an arrangement of transistors according to an example embodiment of the present inventive concept.

Referring to FIG. 4, a substrate SUB (see also FIGS. 5 to 7) may be a semiconductor substrate that may be formed of a semiconductor material such as silicon. A portion of the substrate SUB may be doped with an N-type impurity to form a deep N-type well region NW. A P-type impurity may be doped on the N-type well region NW to form a first P-type well region PW1 and a second P-type well region PW2. The first P-type well region PW1 and the second P-type well region PW2 may be separated by an isolation layer. In addition, active regions ACT1 and ACT2 may be defined by the device isolation layer. The device isolation layer may have a shallow trench isolation (STI) structure.

A first NMOS transistor STR may be formed in the first P-type well region PW1. For example, a first gate structure GS1 may be disposed on the first active region ACT1, and a first source/drain region SD1 may be formed in the first active region ACT1. The first source/drain region SD1 may be formed of an epitaxial layer. First contact plugs CNT1 may be respectively disposed on the first gate structure GS1 and the first source/drain region SD1.

A gate electrode of the first gate structure GS1 may be connected to a selection line through a first contact plug CNT1. A first drain region of the first gate structure GS1 may be connected to a bit line through a first contact plug CNT1 and a via. The first source region of the first gate structure GS1 may be connected to a second source region of the second NMOS transistor CTR through a first contact plug CNT1, a via, and a metal line.

A second NMOS transistor CTR may be formed in the second P-type well region PW2. For example, a second gate structure GS2 may be disposed on the second active region ACT2, and a second source/drain region SD2 may be formed in the second active region ACT2. The second source/drain region SD2 may be formed of an epitaxial layer. Second contact plugs CNT2 may be respectively disposed on the second gate structure GS2 and the second source/drain region SD2.

A gate electrode of the second gate structure GS2 may be connected to a word line through a second contact plug CNT2. A second drain region of the second gate structure GS2 may be connected to a bit line through the second contact plug CNT2 and a via. A second source region of the second gate structure GS2 may be connected to the first source region of the first NMOS transistor STR through the second contact plug CNT2, the via, and a metal line.

Figure 5:
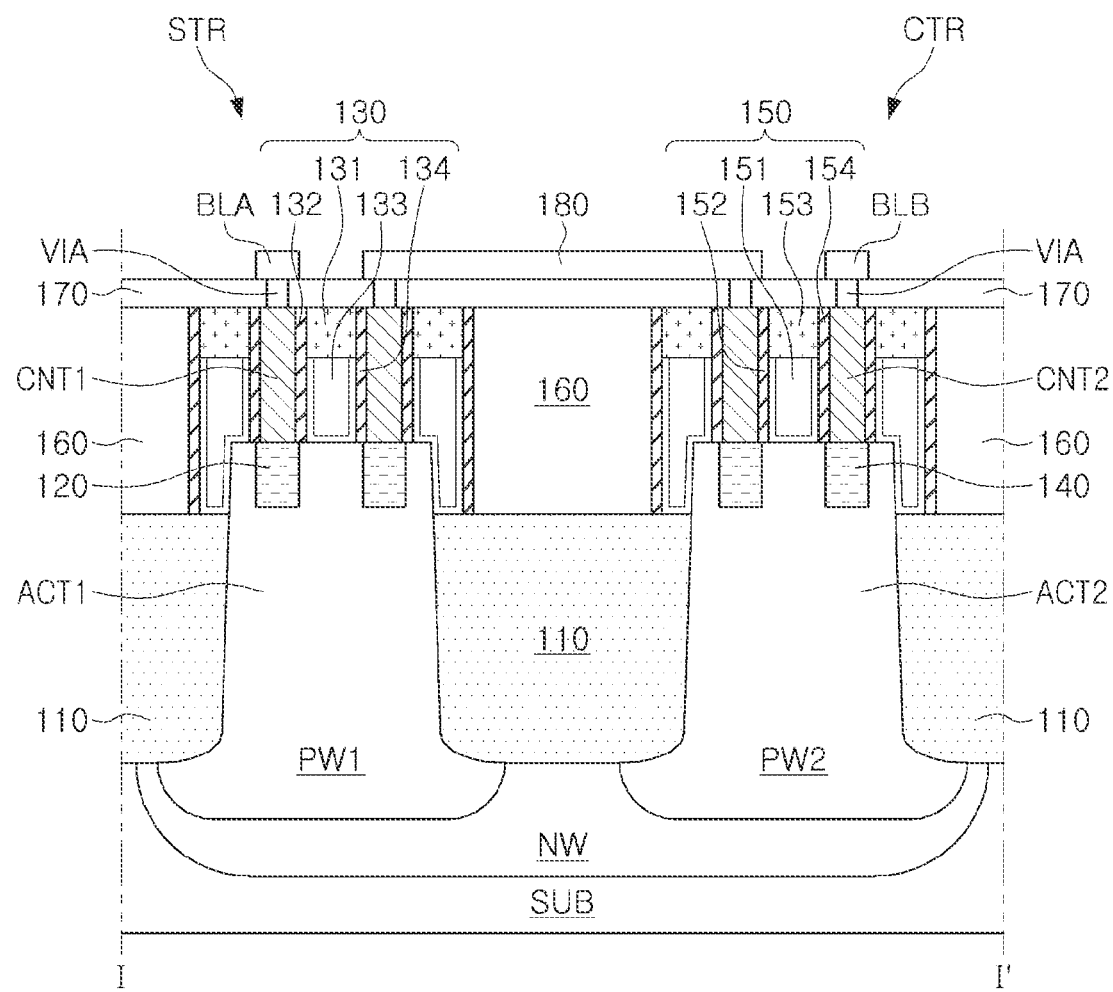
FIG. 5 is a cross-sectional view taken along line I-I' of FIG. 4 according to an example embodiment of the present inventive concept.

FIG. 5 is a cross-sectional view taken along line I-I' of FIG. 4.

Referring to FIG. 5, a portion of the substrate SUB may be doped with an N-type impurity to form a deep N-type well region NW. A P-type impurity may be doped on the N-type well region NW to form a first P-type well region PW1 and a second P-type well region PW2. The first P-type well region PW1 and the second P-type well region PW2 may be separated by a device isolation layer 110 disposed in the substrate SUB. In addition, the device isolation layer may define active regions ACT1 and ACT2 in the substrate SUB. The device isolation layer may have a shallow trench isolation (STI) structure. The active regions ACT1 and ACT2 may extend in a first direction Z, which is perpendicular to an upper surface of the substrate SUB. An interlayer insulating layer 160 may be disposed on the device isolation layer 110.

The first NMOS transistor STR may be formed in the first P-type well region PW1. For example, first gate structures 130 extending in a second direction X and having a portion overlapping the first active region ACT1 may be disposed on the first active region ACT1. First source/drain regions 120 positioned next to the first gate structures 130 and connected to the first active region ACT1 may be formed in the first active region ACT1.

The first gate structure 130 may cross the first active region ACT1. The first gate structure 130 may include a first gate dielectric 132, a first gate electrode 131 on the first gate dielectric 132, a first gate capping layer 133, and a first gate spacer 134. The first gate capping layer 133 may be disposed on the first gate electrode 131. The first gate spacer 134 may be disposed on side surfaces of the first gate electrode 1331 and the first gate capping layer 133. The first gate dielectric 132 may be disposed between the first gate electrode 131 and the first active region ACT1 and may extend between the first gate electrode 131 and the first gate spacer 134.

The first gate dielectric 132 may include at least one of a first silicon oxide and a first high-k dielectric material. For example, the first high-k material may be a metal oxide. The first high-k material refers to a dielectric having a higher dielectric constant than that of the silicon oxide, and may be formed of at least one of, for example, hafnium oxide (HfO), aluminum oxide (AlO), zirconium oxide (ZrO), lanthanum oxide (LaO), etc.

First source/drain regions 120 may be formed on the first active region ACT1 on both sides of the first gate structure 130. First contact plugs CNT1 may be disposed on the first source/drain regions 120. A via may provide an electrical connection between a metal line (BLA) 180 and a first contact plug CNT1 through an insulating layer 170. The first drain region may be connected to a first bit line BLA through the first contact plug CNT1 and the via. The first source region may be connected to a second source region of a second NMOS transistor CTR through the first contact plug CNT1, the via, and the metal line 180.

A second NMOS transistor CTR may be formed in the second P-type well region PW2. For example, second gate structures 150 extending in the second direction X and having a portion overlapping the second active region ACT2 may be disposed on the second active region ACT2. Second source/drain regions 140 positioned next to the second gate structures 150 and connected to the second active region ACT2 may be formed in the second active region ACT2.

Each of the second gate structures 150 may cross the second active region ACT2. Each of the second gate structures 150 may include a second gate dielectric 152, a second gate electrode 151 on the second gate dielectric 152, a second gate capping layer 153, and a second gate spacer 154. The second gate capping layer 153 may be disposed on the second gate electrode 151. The second gate spacer 154 may be disposed on side surfaces of the second gate electrode 151 and the second gate capping layer 153. The second gate dielectric 152 may be disposed between the second gate electrode 151 and the second active region ACT2 and may extend between the second gate electrode 151 and the second gate spacer 154.

The second gate dielectric 152 may include at least one of a second silicon oxide and a second high-k dielectric material. For example, the second high-k material may be a metal oxide. The second high-k material refers to a dielectric having a higher dielectric constant than that of the silicon oxide, and may be formed of at least one of, for example, hafnium oxide (HfO), aluminum oxide (AlO), zirconium oxide (ZrO), lanthanum oxide (LaO), etc. The high-k material may include a charge trapping layer.

Second source/drain regions 140 may be formed on the second active region ACT2 on both sides of the second gate structure 150. Second contact plugs CNT2 may be disposed on the second source/drain regions 140. The via may provide an electrical connection between the metal line (BLB) 180 and the second contact plug CNT2 through the insulating layer 170. The second drain region may be connected to the second bit line BLB through the second contact plug CNT2 and the via. The second source region may be connected to the first source region of the first NMOS transistor STR through the second contact plug CNT2, the via, and the metal line 180.

According to example embodiments, the first active region ACT1 may include a first protrusion penetrating through a device isolation layer 110 and protruding upwardly. The second active region ACT2 may include a second protrusion penetrating through the device isolation layer 110 and protruding upwardly. The first gate structure 130 may cover an upper surface and a side surface of the first protrusion of the first active region ACT1, and the second gate structure 150 may cover an upper surface and a side surface of the second protrusion of the second active region ACT2.

For example, a transistor driven by a high voltage and a transistor driven by a low voltage may have different thicknesses of silicon oxides included in the gate dielectric. For example, the thickness of the silicon oxide of the transistor driven by a high voltage may be thicker than the thickness of the silicon oxide of the transistor driven by a low voltage.

According to an example embodiment of the present inventive concept, each of the memory cell transistor and the selection transistor included in the memory cell may be a transistor driven by a high voltage. Accordingly, the thickness of the silicon oxide of the memory cell transistor and the thickness of the silicon oxide of the selection transistor may be about equal to each other. In addition, for a selection transistor driven by a high voltage to control a bit line bias voltage applied to a memory cell transistor, a transistor driven by a high voltage, e.g., one selection transistor, may be disposed between a source of the memory cell transistor and the first bit line. According to an example embodiment, only one selection transistor is disposed between the source of the memory cell transistor and the first bit line. Accordingly, the number of selection transistors included in the memory cell may be reduced. Since the number of selection transistors included in the memory cell is reduced, the size of the memory cell may be reduced.

FIG. 6 is a cross-sectional view taken along line II-II' of FIG. 4 according to an example embodiment of the present inventive concept. FIG. 7 is a cross-sectional view taken along line of FIG. 4 according to an example embodiment of the present inventive concept.

Referring to FIG. 6, in the first NMOS transistor STR, a first gate electrode 131 of a first gate structure 130 may be connected to a selection line 190 through a first contact plug CNT1. A bit line bias voltage applied to a source of the second NMOS transistor CTR may be controlled, according to a gate voltage applied to the first gate electrode 131 of the first NMOS transistor STR through the selection line 190.

Referring to FIG. 7, in the second NMOS transistor CTR, a second gate electrode 151 of a second gate structure 150 may be connected to a word line 195 through a second contact plug CNT2. During a programming operation of the memory device, a relatively high first word line voltage may be applied to the second gate electrode 151 of the second NMOS transistor CTR through the word line 195. In addition, by applying a relatively high bias voltage to a drain of the second NMOS transistor CTR through a bit line, hot carrier injection in which electrons are injected into the high-k dielectric material of the second NMOS transistor may occur. In this case, a threshold voltage of the second NMOS transistor CTR may increase.

During a read operation of the memory device, a relatively low second word line voltage (or a read voltage) may be applied to the second gate electrode 151 of the second NMOS transistor CTR through the word line 195. In addition, a relatively low bias voltage may be applied to a drain of the second NMOS transistor CTR through a bit line.

When the second NMOS transistor CTR is in a program state, the read voltage may be lower than a threshold voltage of the second NMOS transistor CTR. Accordingly, the second NMOS transistor CTR may be in a turned-off state, and in an example embodiment, current does not flow through the bit line. For example, the memory cell may be an off-cell, and may be a cell in which data "1" is programmed.

When the second NMOS transistor CTR is in an erase state, the read voltage may be higher than a threshold voltage of the second NMOS transistor CTR. Accordingly, the second NMOS transistor CTR may be turned on and a current may flow through the bit line. For example, the memory cell may be an on-cell, and an erased cell.

A method of determining whether a memory cell is an on-cell or an off-cell may be performed by pre-charging the bit line to a power supply voltage VCC and then sensing a bit line voltage or sensing a current flowing through the bit line.

Figure 8:
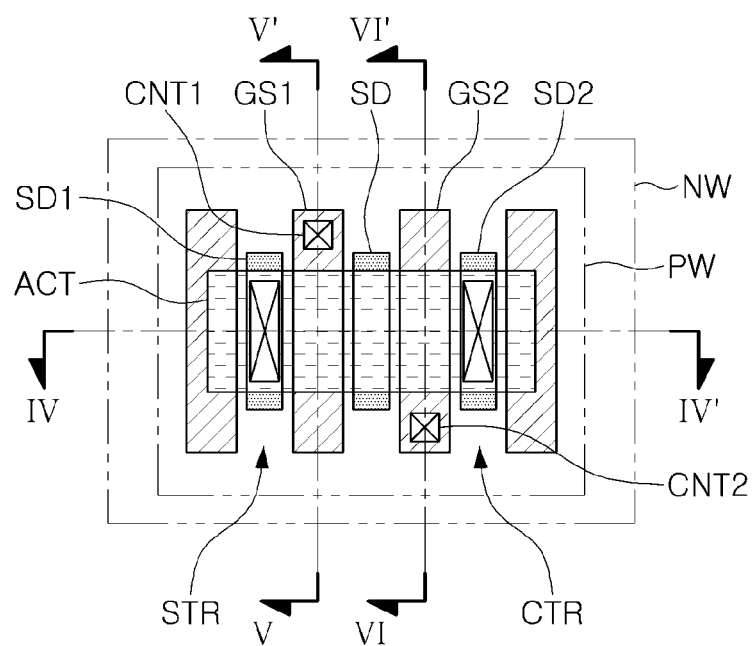
FIG. 8 is a diagram illustrating an arrangement of transistors according to an example embodiment of the present inventive concept.

FIG. 8 is a diagram illustrating an arrangement of transistors according to an example embodiment of the present inventive concept.

Referring to FIG. 8, a substrate SUB (see also FIGS. 9 to 11) may be a semiconductor substrate that may be formed of a semiconductor material such as silicon. A portion of the substrate SUB may be doped with an N-type impurity to form a deep N-type well region NW. A P-type impurity may be doped on the N-type well region NW to form a P-type well region PW. Active regions ACT may be defined by a device isolation layer.

In an example embodiment of FIG. 4, a first P-type well region PW1 in which the first NMOS transistor STR is formed and a second P-type well region PW2 in which the second NMOS transistor CTR is formed may be separated by a device isolation layer.

In an example embodiment of FIG. 8, the first NMOS transistor STR and the second NMOS transistor CTR may be formed in one P-type well region. For example, a first gate structure GS1 may be disposed on the active region ACT, and a first source/drain region SD1 may be formed in the active region ACT. The first source/drain region SD1 may be formed of an epitaxial layer. First contact plugs CNT1 may be respectively disposed on the first gate structure GS1 and the first source/drain region SD1.

A gate electrode of the first gate structure GS1 may be connected to a selection line through a first contact plug CNT1 and a via. A first drain region of the first gate structure GS1 may be connected to a bit line through the first contact plug CNT1 and a via. The first NMOS transistor STR and the second NMOS transistor CTR may share a source with each other.

A second gate structure GS2 may be disposed on the active region ACT, and a second source/drain region SD2 may be formed in the active region ACT. The second source/drain region SD2 may be formed of an epitaxial layer. Second contact plugs CNT2 may be respectively disposed on the second gate structure GS2 and the second source/drain region SD2.

A gate electrode of the second gate structure GS2 may be connected to a word line through the second contact plug CNT2. A second drain region of the second gate structure GS2 may be connected to a bit line through the second contact plug CNT2 and a via. The first NMOS transistor STR and the second NMOS transistor CTR may share a source SD with each other. Since the first NMOS transistor STR and the second NMOS transistor CTR share a source SD with each other, the size of the memory cell may be reduced.

Figure 9:
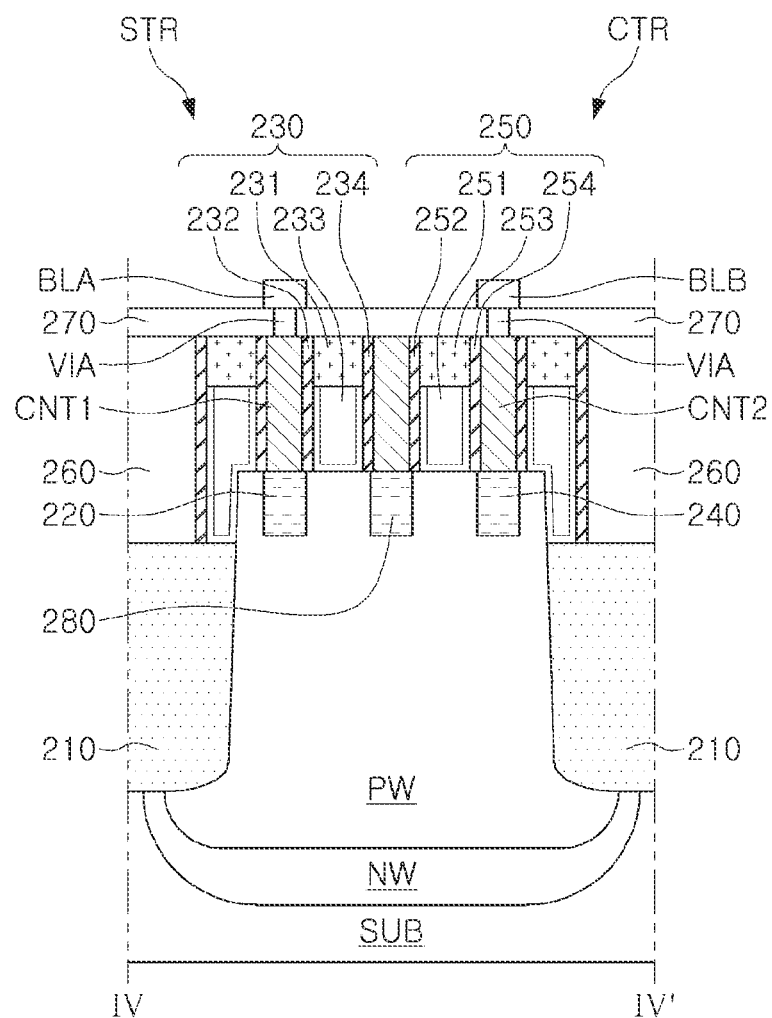
FIG. 9 is a cross-sectional view taken along line IV-IV' of FIG. 8 according to an example embodiment of the present inventive concept.

FIG. 9 is a cross-sectional view taken along line IV-IV' of FIG. 8 according to an example embodiment of the present inventive concept.

Referring to FIG. 9, a portion of the substrate SUB may be doped with an N-type impurity to form a deep N-type well region NW. A P-type impurity may be doped on the N-type well region NW to form a P-type well region PW. A device isolation layer 210 may define active regions ACT in the substrate SUB. The device isolation layer may have a shallow trench isolation (STI) structure. The active regions ACT may extend in a first direction Z perpendicular to an upper surface of the substrate SUB. An interlayer insulating layer 160 may be disposed on the device isolation layer 210.

The first NMOS transistor STR may be formed in the P-type well region PW. For example, the first gate structures 230 extending in a second direction X and having a portion overlapping the active region ACT may be disposed on the active region ACT. First source/drain regions 220 and 280 positioned next to the first gate structures 230 and connected to the active region ACT may be formed in the active region ACT.

The first gate structure 230 may cross the active region ACT. The first gate structure 230 may include a first gate dielectric 232, a first gate electrode 231, a first gate capping layer 233, and a first gate spacer 234. The first gate capping layer 233 may be disposed on the first gate electrode 231. The first gate spacer 234 may be disposed on side surfaces of the first gate electrode 231 and the first gate capping layer 233. The first gate dielectric 232 may be disposed between the first gate electrode 231 and the active region ACT and may extend between the first gate electrode 231 and the first gate spacer 234.

The first gate dielectric 232 may include at least one of a first silicon oxide and a first high-k dielectric material. For example, the first high-k material may be a metal oxide. The first high-k material refers to a dielectric having a higher dielectric constant than that of the silicon oxide, and may be formed of at least one of, for example, hafnium oxide (HfO), aluminum oxide (AlO), zirconium oxide (ZrO), lanthanum oxide (LaO), etc.

A source region 280 and a first drain region 220 may be formed on the active region ACT on both sides of the first gate structure 230. A first contact plug CNT1 may be disposed on the first drain region 220. A via may provide an electrical connection between a metal line BLA and the first contact plug CNT1 through an insulating layer 270. The first drain region 220 may be connected to the first bit line BLA through the first contact plug CNT1 and the via. The first NMOS transistor STR and the second NMOS transistor CTR may share a source region 280 with each other.

The second NMOS transistor CTR may be formed in the P-type well region PW. For example, the second gate structures 250 extending in the second direction X and having a portion overlapping the active region ACT may be disposed on the active region ACT. Second source/drain regions 240 and 280 positioned next to the second gate structures 250 and connected to the active region ACT may be formed in the active region ACT.

The second gate structure 250 may cross the active region ACT. The second gate structure 250 may include a second gate dielectric 252, a second gate electrode 251, a second gate capping layer 253, and a second gate spacer 254. The second gate capping layer 253 may be disposed on the second gate electrode 251. The second gate spacer 254 may be disposed on side surfaces of the second gate electrode 251 and the second gate capping layer 253. The second gate dielectric 252 may be disposed between the second gate electrode 251 and the active region ACT and may extend between the second gate electrode 251 and the second gate spacer 254.

The second gate dielectric 252 may include at least one of a second silicon oxide and a second high-k dielectric material. For example, the second high-k material may be a metal oxide. The second high-k material refers to a dielectric having a higher dielectric constant than that of the silicon oxide, and may be formed of at least one of, for example, hafnium oxide (HfO), aluminum oxide (AlO), zirconium oxide (ZrO), lanthanum oxide (LaO), etc.

A source region 280 and a drain region 240 may be formed on the active region ACT on both sides of the second gate structure 250. A second contact plug CNT2 may be disposed on the drain region 240. A via may provide an electrical connection between a metal line BLB and the second contact plug CNT2 through an insulating layer 270. The second drain region 240 may be connected to the second bit line BLB through the second contact plug CNT2 and the via. The first NMOS transistor STR and the second NMOS transistor CTR may share a source region 280 with each other.

According to example embodiments, the active region ACT may include a protrusion penetrating through the device isolation layer 210 and protruding upwardly, and the first gate structure 230 and the second gate structure 250 may cover an upper surface and a side surface of the active region ACT.

Figure 10:
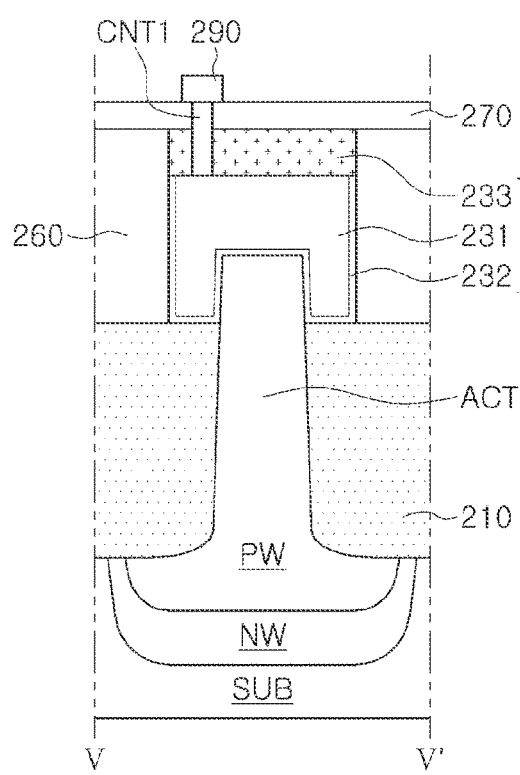
FIG. 10 is a cross-sectional view taken along line V-V' of FIG. 8 according to an example embodiment of the present inventive concept.
Figure 11:
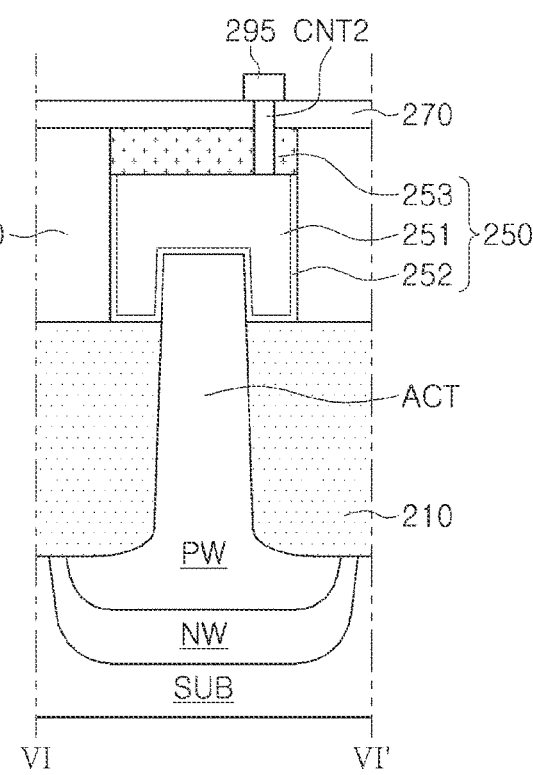
FIG. 11 is a cross-sectional view taken along line VI-VI' of FIG. 8 according to an example embodiment of the present inventive concept.

FIG. 10 is a cross-sectional view taken along line V-V' of FIG. 8 according to an embodiment of the present inventive concept. FIG. 11 is a cross-sectional view taken along line VI-VI' of FIG. 8 according to an embodiment of the present inventive concept.

Referring to FIG. 10, in a first NMOS transistor STR, a first gate electrode 231 of a first gate structure 230 may be connected to a selection line 290 through a first contact plug CNT1. A bit line bias voltage applied to a source of a second NMOS transistor CTR may be controlled, according to a gate voltage applied to the first gate electrode 231 of the first NMOS transistor STR through the selection line 290.

Referring to FIG. 11, in a second NMOS transistor CTR, a second gate electrode 251 of a second gate structure 250 may be connected to a word line 295 through a second contact plug CNT2. Since a programming operation and a read operation of the memory device are similar to the method described with reference to FIG. 7, for convenience of explanation, a further description thereof will be omitted.

Figures 12, 13, 14:
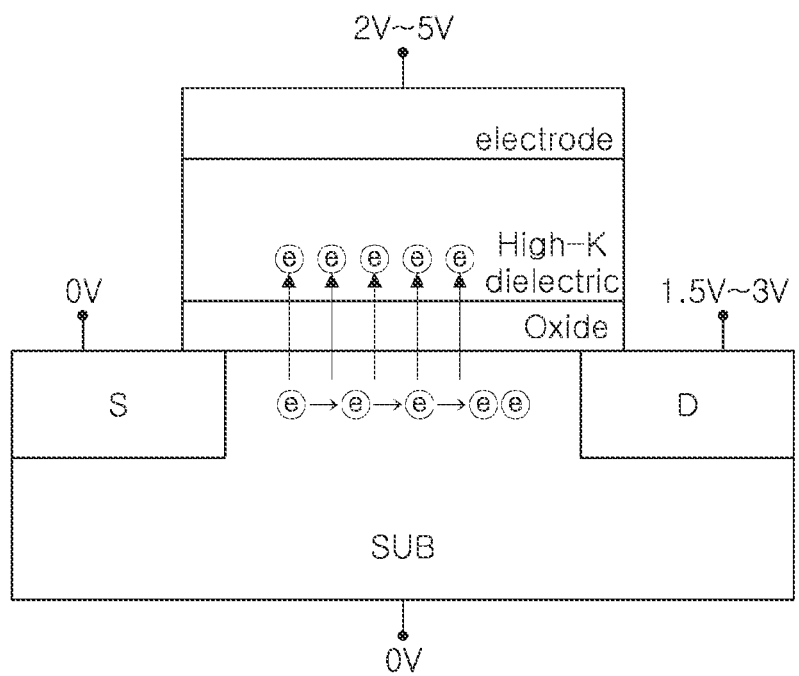
FIGS. 12 and 13 are diagrams provided to illustrate a programming operation according to an example embodiment of the present inventive concept.
FIGS. 14 and 15 are diagrams provided to illustrate an erase operation according to an example embodiment of the present inventive concept.

FIGS. 12 and 13 are diagrams provided to illustrate a programming operation according to an example embodiment of the present inventive concept.

Referring to FIG. 12, selection (SEL) and non-selection (UNSEL) can be distinguished for each node (BLA, SL, WL, BLB, PW, NW), and a level of the bias voltage applied may vary depending on whether the node is a selected node or an unselected node.

As an example, a first bit line bias voltage (e.g., about 0V) may be applied to the selected first bit line BLA, and a second bit line bias voltage (e.g., about 1.5V to about 3V) may be applied to the selected second bit line BLB. A first gate voltage (e.g., about 1.0V to about 2.0V) may be applied to the selected selection line SL, and a first word line voltage (e.g., about 2.0V to about 5.0V) may be applied to the selected word line WL. Since the selection transistor STR is turned on by a gate voltage, a first bit line bias voltage may be applied to the memory cell transistor CTR. Since a first word line voltage is applied to a gate of the memory cell transistor CTR and a voltage difference (e.g., about 1.5V to about 3.0V) is generated between a source and a drain of the memory cell transistor CTR, the memory cell transistor CTR may be turned on. Accordingly, a current may flow to the memory cell transistor CTR, and data may be programmed into the memory cell transistor CTR. In this case, a threshold voltage of the memory cell transistor CTR may increase.

A first bit line bias voltage (e.g., about 1.5 V to about 3 V) may be applied to the unselected first bit line BLA, and a second bit line bias voltage (e.g., about 1.5V to about 3.0V) may be applied to the unselected second bit line BLB. Since the same bias voltage is applied to the unselected first bit line BLA and the unselected second bit line BLB, in an example embodiment, a current does not flow to the memory cell transistor CTR even when the selection transistor STR is turned on by the gate voltage. Accordingly, in an example embodiment, data is not programmed into the memory cell transistor CTR.

Among memory cells sharing the selected bit lines, a second gate voltage (e.g., about 0V) may be applied to the unselected selection line SL, and a second word line voltage (e.g., about 0V) may be applied to the unselected word line WL. Since the memory cell transistor CTR is turned off by the second word line voltage, in an example embodiment, a current does not flow to the memory cell transistor CTR. Accordingly, in an example embodiment, data is not programmed into the memory cell transistor CTR.

Referring to FIG. 13, when a first word line voltage is applied to a gate of the memory cell transistor CTR, and a bias voltage difference occurs between a source and a drain of the memory cell transistor CTR, the memory cell transistor CTR may be turned on. In this case, if a level of the first word line voltage is increased or the bias voltage difference between the source and drain of the memory cell transistor CTR is increased, hot carrier injection may increase. For example, the memory cell transistor and the selection transistor may operate at about 1.8V, but hot carrier injection can be increased by increasing the word line voltage and the bit line bias voltage, respectively. Thereby, a high electric field may be generated between the source and the drain of the memory cell transistor, and hot carriers may be generated. The hot carriers may be trapped in a high-k dielectric material by a gate bias of the memory cell transistor.

In other words, the programming operation may be achieved by injecting electrons into a high-k dielectric material through a high gate voltage and a high drain bias voltage of the memory cell transistor.

Referring back to FIG. 12, the memory cell array may include a plurality of P-type well regions PW, and a predetermined number of word lines may be included in one P-type well region PW. A well bias voltage (e.g., about 0V) may be applied to each of the selected P-type well region PW and the unselected P-type well region PW, and a well bias voltage (e.g., about 2.0V to about 5.0V) may be applied to each of the selected N-type well region NW and the unselected N-type well region NW.

Figures 15, 16:
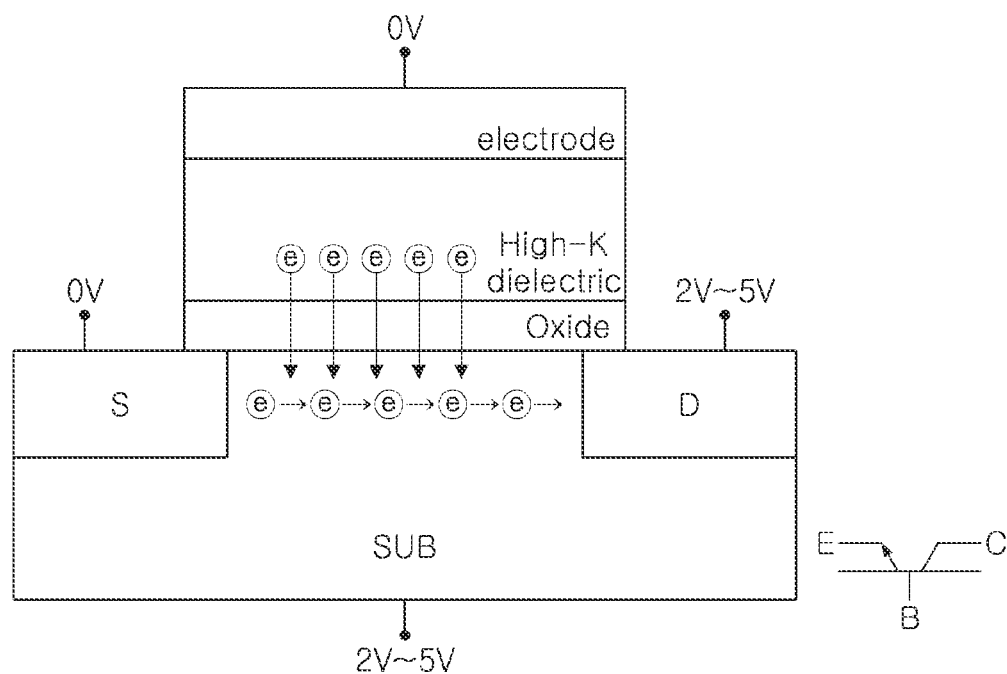
FIG. 16 is a view provided to explain a read operation according to an example embodiment of the present inventive concept.

FIGS. 14 and 15 are diagrams provided to illustrate an erase operation according to an example embodiment of the present inventive concept.

Referring to FIG. 14, selection (SEL) and non-selection (UNSEL) can be distinguished for each node (BLA, SL, WL, BLB, PW, NW), and a level of the bias voltage applied may vary depending on whether the node is a selected node or an unselected node.

As an example, a first bit line bias voltage (e.g., about 0V) may be applied to the selected first bit line BLA, and a second bit line bias voltage (e.g., about 2.5V to about 5V) may be applied to the selected second bit line BLB. A first gate voltage (e.g., about 1.0V to about 2.0V) may be applied to the selected selection line SL, and a first word line voltage (e.g., about 0V) may be applied to the selected word line WL. Since the selection transistor STR is turned-on by a gate voltage, the first bit line bias voltage may be applied to the memory cell transistor CTR.

Referring to FIG. 15, a voltage difference (e.g., about 2.5V to about 5.0V) is generated between a source and a drain of the memory cell transistor CTR, and when a first well bias voltage (e.g., about 2.0V to about 5.0V) is applied to a selected P-type well region PW, a current can flow in a channel similar to an operation of a BJT. In other words, by utilizing a source-substrate-drain structure of the memory cell transistor CTR as an emitter-base-collector of the BJT, a current flows through the memory cell transistor (CTR) during an erase operation. As the current flows, Joule heat may be generated in the channel Such self heating may increase electron de-trapping in a bulk direction.

Referring back to FIG. 14, a well bias voltage (e.g., about 2.0V to about 5.0V) may be applied to each of a selected N-type well region NW and an unselected N-type well region NW. Since a positive well bias voltage is applied to the selected P-type well region PW during the erase operation, to prevent current from passing through a PN junction, a well bias voltage (e.g., about 2.0V to about 5.0V) may be applied to each of the selected N-type well region NW and the unselected N-type well region NW.

When a positive well bias voltage is applied to the P-type well region PW selected in the erase operation, the selection transistor may also be continuously stressed. As described with reference to FIG. 3, a first P-type well region in which the selection transistor STR is disposed and a second P-type well region in which the memory cell transistor CTR is disposed may be separated by a device isolation layer. Accordingly, during the erase operation of the memory device, a level of the first well bias voltage supplied to the first P-type well region in which the selection transistor is disposed and a level of the second well supplied to the second P-type well region in which the memory cell transistor is disposed may be different from each other. For example, the first well bias voltage may be about 0V, and the second well bias voltage may be about 2.0V to about 5.0V.

A first bit line bias voltage (e.g., about 1.5 V to about 3V) may be applied to an unselected first bit line BLA, and a second bit line bias voltage (e.g., about 1.5 V to about 3.0V) may be applied to an unselected second bit line BLB. That is, the same bias voltage may be applied to the unselected first bit line BLA and the unselected second bit line BLB. A second gate voltage (e.g., about 0V) may be applied to the unselected selection line SL, and a second word line voltage (e.g., about 1.5V to about 3V) may be applied to the unselected word line WL. A well bias voltage (e.g., about 0V) may be applied to the unselected P-type well region PW. Accordingly, in an example embodiment, the memory cell transistor CTR is not erased.

FIG. 16 is a view provided to explain a read operation according to an example embodiment of the present inventive concept.

Referring to FIG. 16, selection (SEL) and non-selection (UNSEL) can be distinguished for each node (BLA, SL, WL, BLB, PW, NW), and a level of the bias voltage applied may vary depending on whether the node is a selected node or an unselected node.

As an example, a first bit line bias voltage (e.g., about 0V) may be applied to the selected first bit line BLA, and a second bit line bias voltage (e.g., about 1.0 V to about 2.0V) may be applied to the selected second bit line BLB. A first gate voltage (e.g., about 1.0V to about 2.0V) may be applied to a selected selection line SL, and a first word line voltage (or a read voltage, e.g., about 1.0V to about 2.0V) may be applied to a selected word line WL. A level of a read voltage applied to the word line WL selected in a read operation may be lower than a level of the first word line voltage applied to a gate of the memory cell transistor CTR in a programming operation.

Since the selection transistor STR is turned on by a gate voltage, the first bit line bias voltage may be applied to the memory cell transistor CTR. Accordingly, a voltage difference (e.g., about 1.5V to about 3.0V) may be generated between a source and a drain of the memory cell transistor CTR.

When a first word line voltage is applied to a gate of the memory cell transistor CTR, the selection transistor STR may be turned off or turned on according to a threshold voltage of the memory cell transistor CTR.

When the memory cell transistor CTR is in a program state, the read voltage may be less than a threshold voltage of the second NMOS transistor CTR. Accordingly, in an embodiment, the memory cell transistor CTR may be in a turned-off state, and a current does not flow to a bit line. For example, the memory cell may be an off cell, and may be a cell in which data "1" is programmed.

When the memory cell transistor CTR is in an erase state, the read voltage may be greater than a threshold voltage of the memory cell transistor CTR. Accordingly, the memory cell transistor CTR may be turned on and a current may flow through the bit line. For example, the memory cell may be an on cell and an erased cell.

A method of determining whether a memory cell is an on-cell or an off-cell may be performed by pre-charging a bit line to a power supply voltage VCC and then sensing the bit line voltage, or sensing a current flowing through the bit line. For example, a first input terminal of a sense amplifier may be connected to the second bit line BLB, and a read reference current may be input to a second input terminal of the sense amplifier. The sense amplifier may compare a level of the current flowing through the second bit line BLB with a level of the read reference current, and output a result of the comparison.

A well bias voltage (e.g., about 0V) may be applied to each of the selected P-type well region PW and the unselected P-type well region PW, and a well bias voltage (e.g., about 1.0V) may be applied to each of the selected N-type well region NW and the unselected N-type well region NW. A reason that a level of the well bias voltage applied to the N-type well region NW in a read operation is lower than a level of the well bias voltage applied to the N-type well region NW in program and read operations is because there is no need to use a high bias voltage in a read operation. Accordingly, in the read operation, the level of the well bias voltage applied to the N-type well region NW in the read operation may be a power supply voltage level at which a charge pump does not operate in terms of efficiency.

A first bit line bias voltage (e.g., about 0.3V) may be applied to the unselected first bit line BLA, and a second bit line bias voltage (e.g., about 0V) may be applied to the unselected second bit line BLB. A second gate voltage (e.g., about 0V) may be applied to the unselected selection line SL, and a second word line voltage (e.g., about 0V) may be applied to the unselected word line WL.

Figure 17:
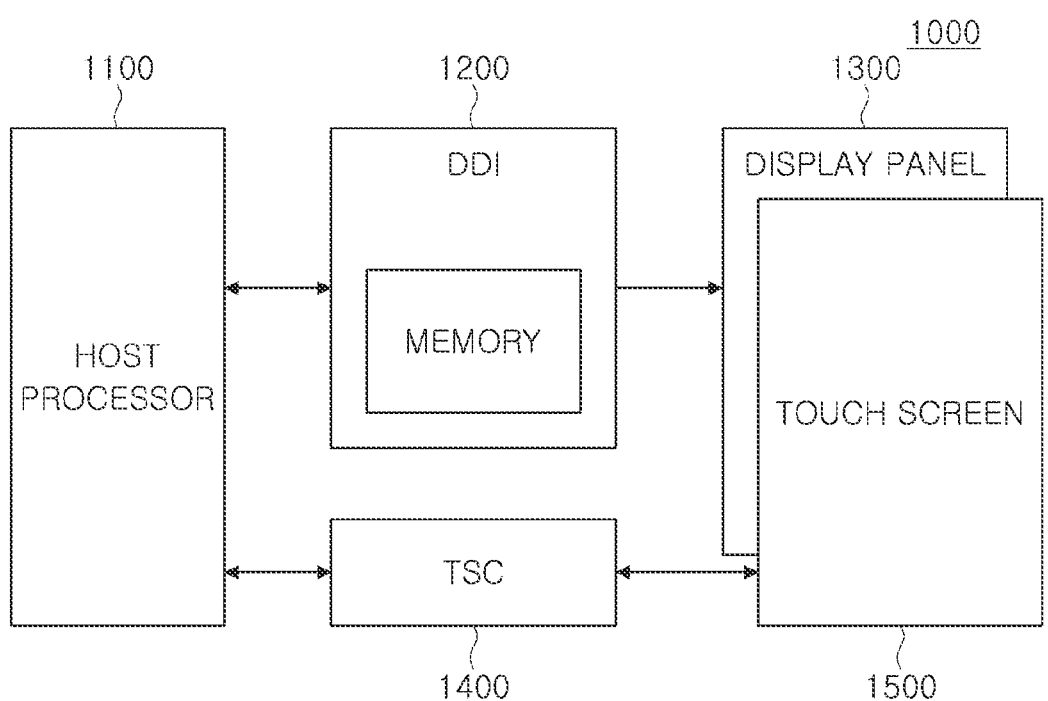
FIG. 17 is a block diagram illustrating a display system according to an example embodiment of the present inventive concept.

FIG. 17 is a block diagram illustrating a display system according to an example embodiment of the present inventive concept.

Referring to FIG. 17, the display system 1000 may include a host processor 1100, a display driver (DDI) 1200, a display panel 1300, a touch screen controller (TSC) 1400, and a touch screen 1500. According to an example embodiment, the display driver 1200 and the touch screen controller 1400 may be implemented as separate chips or as a single chip. According to an example embodiment, the host processor 1100, the display driver 1200, and the touch screen controller 1400 may be implemented as one module, and one system-on-chip.

The touch screen 1500 may be implemented according to various methods such as, for example, a resistive film method, an optical method and a capacitive method, an inductive method, an infra-red(IR) method, a surface acoustic wave (SAW) method, etc. The touch screen 1500 may be formed to overlap the display panel 1300 or to be combined with the display panel 1300.

The touch screen controller 1400 may detect a touch on the touch screen 1500 and generate a touch signal, for example, whether a touch has occurred, touch coordinates, a touch duration time, etc. The touch screen controller 1400 may provide a touch signal to the host processor 1100.

The host processor 1100 may provide display data corresponding to a changed image to a display driver 1200 according to a touch signal received from the touch screen controller 1400.

The display driver 1200 may include a memory including the memory cells described with reference to FIGS. 1 to 16. Since the memory cells described with reference to FIGS. 1 to 16 correspond to MTP memory cells, values set at the time of shipment of a product, or firmware, can be updated using the memory cells.

As set forth above, according to an example embodiment of the present inventive concept, for a selection transistor driven by a high voltage to control a bit line bias voltage applied to a memory cell transistor driven by the high voltage, one selection transistor (e.g., only one selection transistor) may be disposed between a source of the memory cell transistor and a bit line. Accordingly, the number of selection transistors included in the memory cell may be reduced. Since the number of selection transistors included in the memory cell is reduced, the size of the memory cell may be reduced.

While the present inventive concept has been particularly shown and described with reference to example embodiments thereof, it will be understood by those of ordinary skill in the art that various changes in form and detail may be made therein without departing from the spirit and scope of the present inventive concept as defined by the following claims.

What is claimed is:

1. A memory device, comprising:
   a first bit line configured to supply a first bit line bias voltage;
   a memory cell transistor having a first operating voltage;
   a selection transistor having a second operating voltage, and configured to control the supply of the first bit line bias voltage to a source of the memory cell transistor,
   wherein a drain of the selection transistor is connected to the first bit line; and
   a second bit line connected to a drain of the memory cell transistor,
   wherein a level of the first operating voltage is about equal to a level of the second operating voltage.

2. The memory device of claim 1, further comprising:
   a first well bias line configured to apply a first well bias voltage to a first P-type well region in which the selection transistor is disposed; and
   a second well bias line configured to apply a second well bias voltage to a second P-type well region in which the memory cell transistor is disposed.

3. The memory device of claim 2, wherein a level of the first well bias voltage is different from a level of the second well bias voltage, during an erase operation of the memory device.

4. The memory device of claim 1, further comprising:
   a well bias line configured to apply a well bias voltage to a P-type well region in which the selection transistor and the memory cell transistor are disposed.

5. The memory device of claim 1, wherein a source of the selection transistor and a source of the memory cell transistor are connected to each other through a metal line.

6. The memory device of claim 1, wherein the selection transistor and the memory cell transistor share a source with each other.

7. A memory device, comprising:
   a first active region and a second active region disposed on a substrate;
   a first n-type metal-oxide semiconductor (NMOS) transistor disposed on the substrate; and
   a second NMOS transistor disposed on the substrate,
   wherein the first NMOS transistor comprises:
     a first gate structure crossing the first active region; and
     a first source region and a first drain region formed on the first active region on both sides of the first gate structure,
   wherein the second NMOS transistor comprises:
     a second gate structure crossing the second active region; and
     a second source region and a second drain region formed on the second active region on both sides of the second gate structure,
   wherein the first gate structure comprises a first gate dielectric and a first gate electrode disposed on the first gate dielectric,
   wherein the second gate structure comprises a second gate dielectric and a second gate electrode disposed on the second gate dielectric,
   wherein the first gate dielectric comprises a first silicon oxide and a first high-k dielectric material disposed on the first silicon oxide,
   wherein the second gate dielectric comprises a second silicon oxide and a second high-k dielectric material disposed on the second silicon oxide,
   wherein the second high-k dielectric material comprises a charge trapping layer.

8. The memory device of claim 7, wherein a thickness of the first silicon oxide is about equal to a thickness of the second silicon oxide.

9. The memory device of claim 7, further comprising:
   a first contact plug disposed on the first source region; and
   a second contact plug disposed on the second source region,
   wherein the first source region and the second source region are connected to each other through the first contact plug, the second contact plug and a metal line.

10. The memory device of claim 7, further comprising:
    a first contact plug disposed on the first drain region; and
    a second contact plug disposed on the second drain region,
    wherein the first drain region is connected to a first bit line through the first contact plug,
    wherein the second drain region is connected to a second bit line through the second contact plug.

11. The memory device of claim 10, wherein a supply of a first bit line bias voltage of the first bit line is controlled to the second source region, according to a bias voltage applied to the first gate electrode.

12. The memory device of claim 7, further comprising:
    a device isolation layer disposed on the substrate,
    wherein the first active region comprises a first protrusion penetrating upwardly through the device isolation layer,
    wherein the second active region comprises a second protrusion penetrating upwardly through the device isolation layer,
    wherein the first gate structure covers an upper surface and a side surface of the first protrusion of the first active region,
    wherein the second gate structure covers an upper surface and a side surface of the second protrusion of the second active region.

13. The memory device of claim 7, wherein, during an erase operation of the memory device, a level of a first well bias voltage applied to a first P-type well region in which the first NMOS transistor is formed and a level of a second well bias voltage applied to a second P-type well region in which the second NMOS transistor is formed are different from each other.

14. A memory device, comprising:
an active region disposed on a substrate;
a first n-type metal-oxide semiconductor (NMOS) transistor disposed on the substrate; and
a second NMOS transistor disposed on the substrate,
wherein the first NMOS transistor comprises:
   a first gate structure crossing the active region; and
   a source region and a first drain region formed on the active region on both sides of the first gate structure,
wherein the second NMOS transistor comprises:
   a second gate structure crossing the active region; and
   the source region and a second drain region formed on the active region on both sides of the second gate structure,
wherein the first gate structure comprises a first gate dielectric and a first gate electrode disposed on the first gate dielectric,
wherein the second gate structure comprises a second gate dielectric and a second gate electrode disposed on the second gate dielectric,
wherein the first gate dielectric comprises a first silicon oxide and a first high-k dielectric material disposed on the first silicon oxide,
wherein the second gate dielectric comprises a second silicon oxide and a second high-k dielectric material disposed on the second silicon oxide,
wherein the second high-k dielectric material comprises a charge trapping layer.

15. The memory device of claim 14, wherein a thickness of the first silicon oxide is about equal to a thickness of the second silicon oxide.

16. The memory device of claim 14, further comprising:
a device isolation layer disposed on the substrate,
wherein the active region comprises a protrusion penetrating upwardly through the device isolation layer,
wherein the first gate structure and the second gate structure cover an upper surface and a side surface of the protrusion of the active region.

17. The memory device of claim 14, further comprising:
a first contact plug disposed on the first drain region; and
a second contact plug disposed on the second drain region,
wherein the first drain region is connected to a first bit line through the first contact plug,
wherein the second drain region is connected to a second bit line through the second contact plug.

18. The memory device of claim 17, wherein a supply of a first bit line bias voltage of the first bit line to the source region is controlled to the source region, according to a bias voltage applied to the first gate electrode.

19. The memory device of claim 18, wherein, during a programming operation of the memory device, charges are trapped into the second high-k dielectric material, based on the first bit line bias voltage applied to the source region, a second bit line bias voltage of a second bit line applied to the second drain region, and a word line voltage applied to the second gate electrode.

20. The memory device of claim 18, wherein, during an erase operation of the memory device, charges trapped in the second high-k dielectric material are de-trapped, based on the first bit line bias voltage applied to the source region, a second bit line bias voltage of a second bit line applied to the second drain region, and a well bias voltage applied to a P-type well region in which the second NMOS transistor is formed.

* * * * *